United States Patent
Beck

(10) Patent No.: US 10,823,799 B2
(45) Date of Patent: Nov. 3, 2020

(54) METHOD AND APPARATUS FOR ACCELERATED GENERATION OF A SERIES OF MAGNETIC RESONANCE IMAGES WITH SIMULTANEOUS MULTISLICE IMAGING

(71) Applicant: Siemens Healthcare GmbH, Erlangen (DE)

(72) Inventor: Thomas Beck, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 15/920,964

(22) Filed: Mar. 14, 2018

(65) Prior Publication Data

US 2018/0267123 A1 Sep. 20, 2018

(30) Foreign Application Priority Data

Mar. 14, 2017 (EP) ..................................... 17160758

(51) Int. Cl.
*G01R 33/483* (2006.01)
*G01R 33/56* (2006.01)
(Continued)

(52) U.S. Cl.
CPC ..... *G01R 33/4835* (2013.01); *G01R 33/5608* (2013.01); *G01R 33/5611* (2013.01); *G01R 33/5676* (2013.01)

(58) Field of Classification Search
None
See application file for complete search history.

(56) References Cited

U.S. PATENT DOCUMENTS 7,408,345 B2 * 8/2008 Bammer ............ G01R 33/4824
324/307
9,940,713 B1 4/2018 Bhat et al.
(Continued)

FOREIGN PATENT DOCUMENTS

DE 10 2015 207 591 A1 10/2016
DE 102017201477 A1 8/2018

OTHER PUBLICATIONS

Breuer et al., "Controlled Aliasing in Parallel Imaging Results in Higher Acceleration (CAIPIRINHA) for Multi-Slice Imaging", Magnetic Resonance in Medicine, vol. 53, pp. 684-691 (2005).
(Continued)

*Primary Examiner* — Douglas X Rodriguez
(74) *Attorney, Agent, or Firm* — Schiff Hardin LLP

(57) ABSTRACT

In a magnetic resonance imaging method and apparatus for generating a number of image data sets of an image recording region of an examination object, at least one set of reference magnetic resonance raw data is acquired from the image recording region. Furthermore, a number of magnetic resonance raw data sets are acquired temporally sequentially. At least some of the magnetic resonance raw data sets are recorded with an SMS image recording sequence and a number of image data sets are reconstructed on the basis of the acquired magnetic resonance raw data sets. A number of SMS image data sets are each reconstructed on the basis of one of the magnetic resonance raw data sets recorded with an SMS image recording sequence, and each on the basis of one and the same set of reference magnetic resonance raw data.

13 Claims, 5 Drawing Sheets

(51) Int. Cl.
  *G01R 33/561* (2006.01)
  *G01R 33/567* (2006.01)

(56) References Cited

U.S. PATENT DOCUMENTS

| | | | |
|---|---|---|---|
| 2011/0044524 A1* | 2/2011 | Wang | G01R 33/54 382/131 |
| 2012/0319686 A1* | 12/2012 | Jesmanowicz | A61B 5/055 324/309 |
| 2015/0115958 A1 | 4/2015 | Wang et al. | |
| 2018/0217219 A1 | 8/2018 | Beck et al. | |
| 2018/0238983 A1* | 8/2018 | Cohen | G01R 33/543 |

OTHER PUBLICATIONS

Bhat et al., "Accelerated whole-body diffusion weighted imaging with blipped CAIPIRINHA based simultaneous multislice acquisition", Proc. Intl. Soc. Mag. Reson. Med., vol. 22, p. 3631 (2014).
Larkman, et al., "Use of Multicoil Arrays for Separation of Signal from Multiple Slices Simultaneously Excited", Journal of Magnetic Resonance Imaging, vol. 13, pp. 313-317 (2001).
Barth et al., "Simultaneous Multislice (SMS) Imaging Techniques", Magnetic Resonance in Medicine, vol. 75, No. 1, pp. 63-81 (2016).
Feinberg et al., "Ultra-fast MRI of the human brain with simultaneous multi-slice imaging", Journal of Magnetic Resonance, vol. 229, pp. 90-100 (2013).
Griswold et al., "Generalized Autocalibrating Partially Parallel Acquisitions (GRAPPA)", Magnetic Resonance in Medicine, vol. 47, pp. 1202-1210 (2002).
Souza et al., "SIMA: Simultaneous Multislice Acquisition of MR Images by Hadamard-Encoded Excitation", Journal of Computer Assisted Tomography, vol. 12, No. 6, pp. 1026-1030 (1988).
Stäb et al., "CAIPIRINHA Accelerated SSFP Imaging", Magnetic Resonance in Medicine, vol. 65, pp. 157-164 (2011).
Setsompop, Kawin et al. "Blipped-Controlled Aliasing in Parallel Imaging for Simultaneous Multislice Echo Planar Imaging with Reduced g-Factor Penalty" Magnetic Resonance in Medicine, vol. 67, pp. 1210-1224, 2012 (first published online 2011)// DOI 10.1002/mrm.23097.
European Action dated Oct. 31, 2019, for Application No. 17 160 758.3.
European Action dated May 19, 2020, Application No. 17 160 758.3 (with English machine translation).
European Action dated Oct. 31, 2019, Application No. 17 160 758.3 (with English machine translation).

* cited by examiner

METHOD AND APPARATUS FOR ACCELERATED GENERATION OF A SERIES OF MAGNETIC RESONANCE IMAGES WITH SIMULTANEOUS MULTISLICE IMAGING

BACKGROUND OF THE INVENTION

Field of the Invention

The invention concerns a magnetic resonance imaging method for generating multiple of image data sets of an image recording region of an examination object. The invention also concerns a control computer and a magnetic resonance imaging apparatus that implement such a method.

Description of the Prior Art

In magnetic resonance tomography, a static constant magnetic field $B_0$, which serves for initial orientation and homogenization of magnetic dipoles (nuclear spins) that are to be investigated is typically overlaid with a rapidly switched magnetic field, called the "gradient field," which spatially encodes the MR signal. For determining the material properties of an examination object to be imaged, the dephasing or relaxation time of the nuclear spins, following a deflection of the magnetization thereof from the starting orientation is determined, so that different material-typical relaxation mechanisms or relaxation times can be identified. The deflection usually takes place by radiation of a number of RF pulses, and the spatial resolution is based upon a temporally fixed manipulation of the deflected magnetization with the use of the gradient field in a "scan sequence" or "activation sequence," which specifies a precise temporal sequence of RF pulses, the changing of the gradient field (by transmitting a switching sequence of gradient pulses) and the acquisition of scan values (MR signals). Apart from the relaxation, there is also a series of further mechanisms for contrast formation, for example, flux measurement and diffusion imaging.

Typically, an allocation takes place between the measured magnetization—from which the aforementioned material properties can be derived—and a spatial coordinate of the scanned magnetization in the spatial domain in which the examination object is situated, with the use of an intermediate step. In this intermediate step, acquired magnetic resonance raw data are entered at readout points in a memory organized as k-space. The coordinates of the data entered in k-space are encoded as a function of the gradient field. The amount of the magnetization (in particular the transverse magnetization determined in a plane transverse to the constant magnetic field) at a defined location of the examination object can be determined from k-space data with the use of a Fourier transformation. Expressed differently, k-space data (magnitude and phase) are needed to calculate a signal strength of the MR signal, and possibly its phase in the spatial domain.

Magnetic resonance tomography is a relatively slowly functioning type of imaging method, since the data are recorded sequentially along trajectories, for example, lines or spirals, in k-space. The method for recording images in two-dimensional slices is significantly less error-prone compared with recording in three dimensions, since the number of encoding steps is smaller than in a three-dimensional method. Therefore, in many applications, data are acquired in an image volume as a stack of two-dimensional slices, rather than in a single three-dimensional recording. However, the image recording times are still very long due to the long relaxation times of the spins that are usually of interest, which can cause discomfort for the patient being examined.

With another scanning type, selectively excited subvolumes known as "slabs" are spatially-encoded with the use of a three-dimensional scanning method.

If a number of image recordings from a patient are made directly one after another with different sequences having different contrast levels, it is also particularly important that the multiple images thereby recorded can be represented in coincident slices over the whole imaging period. Individual scans of a study are carried out temporally sequentially, and by functionality and entries made via a user interface, a consistent slice orientation and slice count, as well as a consistency of any additional saturation bands or similar present can be achieved. The individual scans are subsequently carried out largely independently of one another. The expression "sequence" or "imaging sequence" is to be understood as a pulse sequence generated for imaging and played out via gradient coils and RF coils for generating MR signals, on the basis of which raw data are generated, from which image data are reconstructed. Such a pulse sequence is initially generated as an activation sequence and is played out via a control computer in the form of electronic output signals formulated as pulses corresponding to the control instructions of the activation sequence.

In order to accelerate the image recordings or to accelerate the necessary scan duration for the acquisition of an individual image volume, in recent years, a slice-based acceleration technology has become established. With this known technology under the designations "simultaneous multislice" (abbreviated SMS or SAMS), "slice acceleration" or "multiband", a number of slices are excited and read out simultaneously (e.g. Breuer et al. MRM 53:684 (2005), Souza et al. JCAT 12:1026 (1988), Larkman et al. JMRI 13:313 (2001), MRM=Magnetic Resonance in Medicine, JMRI=Journal of Magnetic Resonance Imaging, JCAT=Journal of Computer Assisted Tomography). For example, with an acceleration factor of 3, three slices are simultaneously excited and read out. By this means, the required repetition time TR (repetition time TR=time until successive pulse sequences are applied to the same slice) is reduced to a third of the necessary time. Accordingly, in functional imaging (fMRI, BOLD) or in diffusion imaging by echo-planar recording, the required time for the acquisition of a volume can be reduced to a third of the otherwise necessary time. In the literature, primarily the reduction of the scan time or the improvement of the temporal scan rate is given as the advantage of these methods.

Also in the scanning of selectively excited subvolumes also, the possibility exists, with the use of a "multislab" imaging, of scanning a number of subvolumes or partial volumes simultaneously in order to accelerate the recording process. Such a procedure can be regarded as an intermediate stage between a 2D multilayer imaging process and a complete 3D imaging process.

In order to be able to disassemble the simultaneously scanned slices or subvolumes in the context of the image reconstruction into individual slices, typically before the start of each individual scan, an additional calibration image recording (also "reference image recording") is carried out. The time required for the reference image recordings further reduces the time saving achieved through the SMS technique described, so that, particularly for clinically relevant, typically very short protocols, the time saving is reduced again.

In the event of movement by the patient, the consistency of the scanned data is lost in the imaging method described, and this is reflected in image artifacts in the reconstructed image. For this reason, it is worthwhile to compensate for movement of the patient. This takes place either retrospectively (following the scan) or prospectively (during the scan).

Methods for prospective image correction correct the movement of the patient during the execution of the scan. This takes place, for example, by the field of view (FoV), which represents the portion of the anatomy to be acquired, is modified during the scan so that the anatomy contained therein does not change despite the movement. In order to achieve this, a number of methods are known. For example, external systems, in particular cameras, are used for monitoring the position of the examination object. Monitoring can also be realized with the use of markers that are visible by detectors in a magnetic resonance tomography apparatus. During the monitoring, in place of markers, characteristic anatomical structures can also be observed. Furthermore, additional image-based navigators are used in order to detect a position change in the examination object and to track the field of view accordingly.

In the use of image-based navigators, the imaging MR sequence is used to represent the anatomy in navigator images acquired at sequential time points. Typically, at the start of the scan, a reference volume is scanned and subsequent navigator images are registered to this reference time point. The detected movement is then fed back to the MR pulse sequence and the field of view or the image region is tracked by this movement for subsequent partial acquisitions, and thus compensation for the movement already occurs during the scan.

A problem in movement correction with the use of navigators is that the recording of the navigator image and the acquisition of the MR signal for imaging take place slightly offset in time. Even for the case of the completed movement of the navigator being exactly detected and compensated for by the sequence, resultant artifacts remain in the MR data, since the movement portion between the time point of the acquisition of the navigator and the time point of the acquisition of the desired MR imaging signal is not captured and therefore cannot be compensated for.

The additional recording of the navigators also involves an additional time cost, such that the imaging sequence cannot be carried out with optimum efficiency.

SUMMARY OF THE INVENTION

An object of the present invention is to provide a method for operation of a magnetic resonance imaging apparatus with which a series of image recordings are carried out with different sequence protocols in a shorter time, or with improved consistency, with a simultaneous preservation of the image quality.

In the inventive magnetic resonance imaging method for generating a number of image data sets of an imaging region of an examination object, at least one set of reference magnetic resonance raw data are acquired from the image recording region. Such a set of reference magnetic resonance raw data serves for calculating a number of convolution kernels with which, following a simultaneous MR image recording of a number of slices, the scanned information regarding the number of slices is disassembled into image information associated with the individual slices. The disassembly into individual slices can take place in k-space and in the image domain, but a disassembly of simultaneously recorded slices into individual slices in k-space is preferable.

A number of magnetic resonance raw data sets are captured temporally sequentially, wherein at least a number of the magnetic resonance raw data sets are recorded with an SMS image recording sequence. As mentioned, such an SMS image recording sequence is an MR image recording sequence in which multiple slices of the examination region are recorded simultaneously.

The expression SMS image recording sequence is also intended to cover the aforementioned scanning method in which, in place of a number of slices, a number of selectively excited subvolumes known as "slabs" are spatially-encoded and simultaneously read out with the use of a three-dimensional scanning method.

Furthermore, a reconstruction of a number of image data sets takes place on the basis of the acquired magnetic resonance raw data sets. Respective SMS image data sets each reconstructed on the basis of one of the magnetic resonance raw data sets recorded with an SMS image recording sequence, and respectively on the basis of one and the same set of reference magnetic resonance raw data.

Advantageously, in the inventive magnetic resonance imaging method, at least a part of the successive MR recordings, whether image recordings and/or navigator recordings are recorded with an accelerated recording sequence, a so-called "SMS image recording sequence". Particularly advantageously, a single recording of reference raw data is used as reference data for a number of accelerated MR recordings, so that such an, often time-consuming, reference recording does not have to be carried out anew for each of these recordings. The recording of the reference data takes place unaccelerated, so that it requires a particularly large amount of time. Because the number of reference data sets to be recorded is reduced through re-use in accordance with the invention, the entire image recording process is also particularly strongly accelerated. Thus, the entire magnetic resonance imaging method takes place significantly faster than in a conventional procedure. An additional time gain results therefrom that the kernel for separating the simultaneously recorded slices must only be calculated once for a reference data set. Since the calculation of this kernel contributes a significant proportion to the reconstruction time, by means of a re-use of a reference data set, a particularly large amount of time can be gained.

In the use of many clinical protocols, a number of image contrasts are used sequentially with different sequences having identical slice positions. For a number of SMS-accelerated sequences, in this case, the same reference data are re-used in each case.

The use of a common reference data set can always take place if the examination object does not move too greatly between the use of different recording sequences, so that the orientation in space changes only slightly and an identical anatomy is imaged. Also advantageous is an identical slice count, but for different slice counts with sequential image recordings with the use of an interpolation of the reference data, an adaptation to the correct number of respectively recorded slices can take place, as described below.

The inventive control computer has an activation interface that emits control signals, generated in the computer, to a scanner of a magnetic resonance apparatus system in order to activate the scanner with an image recording sequence so as to generate a number of image data sets of an image recording region of an examination object. The inventive control computer also has a reference sequence generating processor that generates a reference image recording subsequence for acquiring at least one set of reference magnetic resonance raw data from the image recording region. The inventive control computer also has an image sequence generating processor that generates a number of image recording subsequences for the temporally sequential acquisition of magnetic resonance raw data sets, wherein at least some of the image recording subsequences form an SMS image recording sequence. Furthermore, the inventive control computer has a reconstruction processor that reconstructs multiple image data sets on the basis of the acquired magnetic resonance raw data sets, the number of SMS image data sets each being recorded on the basis of one of the magnetic resonance raw data sets recorded with an SMS image recording sequence, and each on the basis of one and the same set of reference magnetic resonance raw data.

The inventive magnetic resonance imaging apparatus has a scanner and an inventive control computer that activates the scanner.

The basic components of the inventive control computer can be configured mainly in the form of software components. This relates in particular to the activation interface, the reference sequence generating processor, the image sequence generating processor and the reconstruction processor. These components can also be realized particularly if rapid calculations are involved, in the form of software-supported hardware, for example, FPGAs or the like. Similarly, the required interfaces can be configured, for example, where only an acceptance of data from other software components is concerned, as software interfaces. However, they can also be configured as interfaces constructed from hardware, which are controlled by suitable software.

A realization largely through software has the advantage that conventionally used control devices can easily be upgraded with a software update in order to operate in the manner according to the invention.

Accordingly, the present invention also encompasses a non-transitory, computer-readable data storage medium that, when loaded into a control computer of a magnetic resonance apparatus, cause the control computer to operate the magnetic resonance apparatus so as to implement any or all of the embodiments of the method according to the invention, as described herein.

The computer-readable data storage medium can be, for example, a memory stick, a hard disk or another transportable or firmly installed data carrier on which the program code is stored.

In the context of the invention, the different features of different exemplary embodiments can be combined to form other exemplary embodiments.

In a preferred embodiment of the inventive magnetic resonance imaging method, the plurality of magnetic resonance raw data sets are acquired temporally sequentially with differently selected imaging parameters. This means that the successive individual imaging sequences for recording different magnetic resonance raw data sets differ with regard to one or more imaging parameters. Such imaging parameters include all the parameters settable in an imaging sequence or a protocol underlying the imaging sequence. Preferably, imaging parameters comprise parameters of an imaging sequence that influence the image quality, such as the contrast, the image recording region and its position or the image size.

In an embodiment of the inventive magnetic resonance imaging method, exactly one set of reference magnetic resonance raw data is acquired from the image recording region and all SMS image data sets are reconstructed on the basis of one of the magnetic resonance raw data sets recorded with an SMS image recording sequence and are each reconstructed on the basis of the common set of reference magnetic resonance raw data. With this embodiment, the effort for the recording of the reference raw data is minimized so that the acceleration potential of the application of an SMS image recording sequence can be optimally used.

It is preferred if the image data sets include diagnostic image data and navigator image data used for image display of the image recording region. The navigator image data can be navigator image data sets used for movement correction of the diagnostic image data, which can also be in sets used for image display. Particularly with a relatively large number of sequentially recorded image data sets that are recorded, for example, with different imaging parameters or different contrast levels, it is useful to correct any movements of the examination object that occur, with the use of navigator data, in order to reduce movement artifacts in the image display. For movement correction, for example, magnetic resonance raw data sets can be acquired for reconstruction of navigator image data sets between the recording of magnetic resonance raw data sets that are used for the reconstruction of an image display of the image recording region. In this way, movement corrections are carried out distributed over the entire image recording process, so that the artifacts produced due to a movement of the region to be imaged can be reduced in a finely resolved manner.

In the use of navigators, a co-registration of the sequentially performed image recordings can be carried out to compensate for the patient movement. Particularly in the case of imaging sequences with different imaging parameters for the overlaying of the different image contrast levels, decisive advantages are acquired, since a majority of the patient movement can be compensated for in advance during the image recording. A retrospective interpolation or co-registration of the image data is thereby reduced, so that, inter alia, interpolation artifacts can be minimized.

Alternatively or additionally, the movement correction can take place using navigator information that has been obtained by an acquisition with an external camera and/or with the use of markers. In this embodiment, no additional MR recording sequences must be executed in the imaging process, so that an acceleration of the entire image recording process can be achieved.

In another embodiment of the inventive magnetic resonance imaging method, a magnetic resonance raw data set is acquired for reconstruction of a reference navigator image data set wherein the reference navigator image data set is used as a reference image for a movement correction on the basis of the navigator image data sets. In this embodiment, initially, a reference image is acquired as a reference for the later-recorded navigator images. By comparison of the navigator images with the reference image, in the course of the imaging procedure, or subsequently, a movement of the recording region can be detected and, if necessary, compensated for or corrected.

The comparison of the movement reference image with the navigator images can take place both in the image domain, also called the image data domain, as well as in k-space. The determination of the movement parameters to be determined by the comparison (usually 6 rigid degrees of freedom (3 translational and 3 rotational)) can thus be carried out in both spaces. A rotation in the image space corresponds to an identical rotation in k-space and a translation in the image domain corresponds to a multiplication by a phase ramp in k-space. A preferred implementation is based on a detection of the movement parameters in the image domain.

Preferably, at least one magnetic resonance raw data set is acquired for reconstruction of navigator image data sets during at least one short interruption of a recording of magnetic resonance raw data sets, which are used for the reconstruction of an image display of the image recording region.

The interruption can take place, for example, between recordings with different image recording parameters. The interruption can also take place within an image recording with the same image recording parameters if individual image recordings require particularly much time or the examination object or the examination region is moving severely.

In another embodiment of the inventive magnetic resonance imaging method, a number of the magnetic resonance raw data sets which are used for the reconstruction of an image display of the image recording region, are acquired with an SMS image recording sequence and SMS image data sets are each reconstructed on one of the plurality of the multiple raw data sets and each on the basis of one and the same set of reference magnetic resonance raw data. Through the use of the accelerated imaging methods for the usually high-resolution and time-consuming imaging processes, the entire image recording process can be particularly strongly accelerated. Since for the disassembly of the scanned information relating to a plurality of slices, image information of one and the same reference data set allocated into the individual slices is used, the effort for obtaining reference data can be severely reduced and so the entire process can be particularly strongly accelerated.

In a preferred embodiment of the inventive imaging method, at least some of the magnetic resonance raw data sets is captured for reconstruction of navigator image data sets with an SMS image recording sequence. Herein, SMS navigator image data sets are each reconstructed on the basis of one of the multiple magnetic resonance raw data sets, each on the basis of one and the same set of reference magnetic resonance raw data. While the navigator image data are also generated in an accelerated manner, a further acceleration of the imaging process can be achieved.

The acceleration of the imaging process is particularly marked if at least part of the SMS navigator image data sets and some of the SMS image data sets are reconstructed on the basis of a common set of reference magnetic resonance raw data. Then only a single reference data set must be recorded both for the accelerated performance of the actual image recording and also for the recording of the navigator data, so that the entire image recording process is further accelerated.

It is preferred if all the SMS navigator image data sets and all the SMS image data sets are reconstructed on the basis of a common set of reference magnetic resonance raw data. Then, the time saving is particularly marked due to the reference magnetic resonance raw data used in common.

The image recording sequences used with the sequentially performed image recordings can particularly advantageously have different contrast levels in order to obtain additional information from an examination region. For this purpose, differently selected imaging parameters are used. The different imaging parameters can comprise at least one of the following variables:
the amplitude value,
the amplitude variation,
the start point and duration,
the number of excitation pulses,
the sequence type,
the slice thickness,
the slice orientation.

The amplitude value, the amplitude variation and the start time point and duration preferably relate to the gradient pulses played out in an image recording sequence.

In the case of a known patient movement between successive image recoding processes, for example, a compensation of the change of the slice orientation according to co-pending U.S. patent application Ser. No. 15/351,471 can take place.

If the slice count or the slice orientation changes between individual image recordings, then a re-use of the reference data can be facilitated in that initially a high-resolution 3D image recording takes place as a reference recording. In the context of the calculation of the slice separation kernel, subsequently, interpolation takes place from the 3D reference recording to the correct slice count and slice orientation. A method for the interpolation of the reference data in the kernel re-calculation during a single scan is described, for example, in the German patent application 10 2017 201 477. In this way, scan protocols with mutually different imaging parameters can also be brought into use with only a single reference image recording.

The aforementioned navigator image data can be used, for example, for real time position correction of the current image recording region of the examination object, also known as prospective movement correction. This means the navigator image data are used as information relating to a movement of the recording region. This information is used for the orientation of the image portions to be scanned in future, so that a prospective movement compensation is achieved. Thus the recording region can be tracked accordingly during the image recording, so that displacements and artifacts within an individual image recording and between temporally sequentially recorded image data can be reduced.

Furthermore, the acquired navigator image data can alternatively or additionally be used for retrospective position correction of recorded image data. In this case, the simultaneously captured navigator image data can be used to correct the simultaneously captured image data from the image volume with regard to artifacts due to movements of the image volume to be recorded. With additional use of a retrospective correction, the quality of the image recordings can be further improved.

In a preferred embodiment of the inventive magnetic resonance imaging method, the number of slices in the recording of the navigator data is smaller than the number of slices in the actual image recording. In addition, the recording of the navigator data takes place with a higher acceleration factor. Both measures result, during the recording of the navigator data, in the examination region being scanned at a higher speed or more frequently than during the actual image recording. Advantageously, in this way the time expenditure during the recording of the navigator raw data can be reduced.

Alternatively, the examination region can be acquired at a higher resolution during the recording of the navigator data than in the actual diagnostic image recording if, for example, a robust three-dimensional movement detection is required for an imaging volume which consists of a very low number of slices.

DESCRIPTION OF THE PREFERRED EMBODIMENTS

Figure 1:
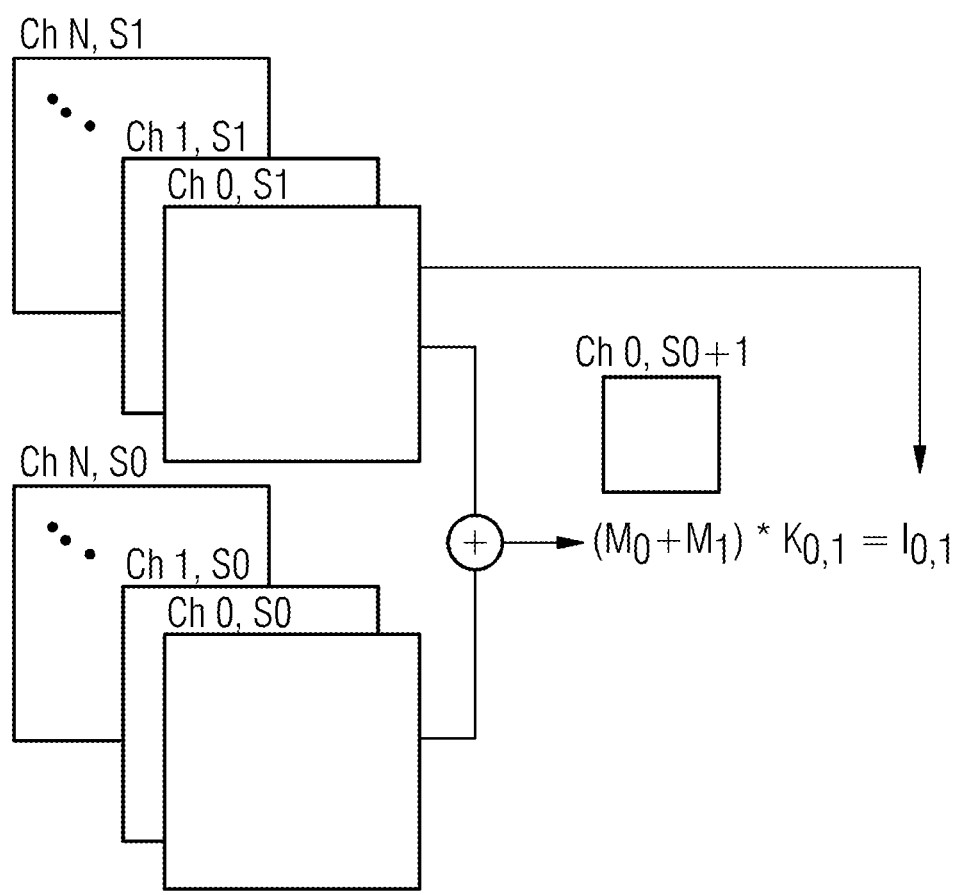
FIG. 1 illustrates the calculation of convolution matrices and convolution cores in the context of a reference scan.
Figure 2:
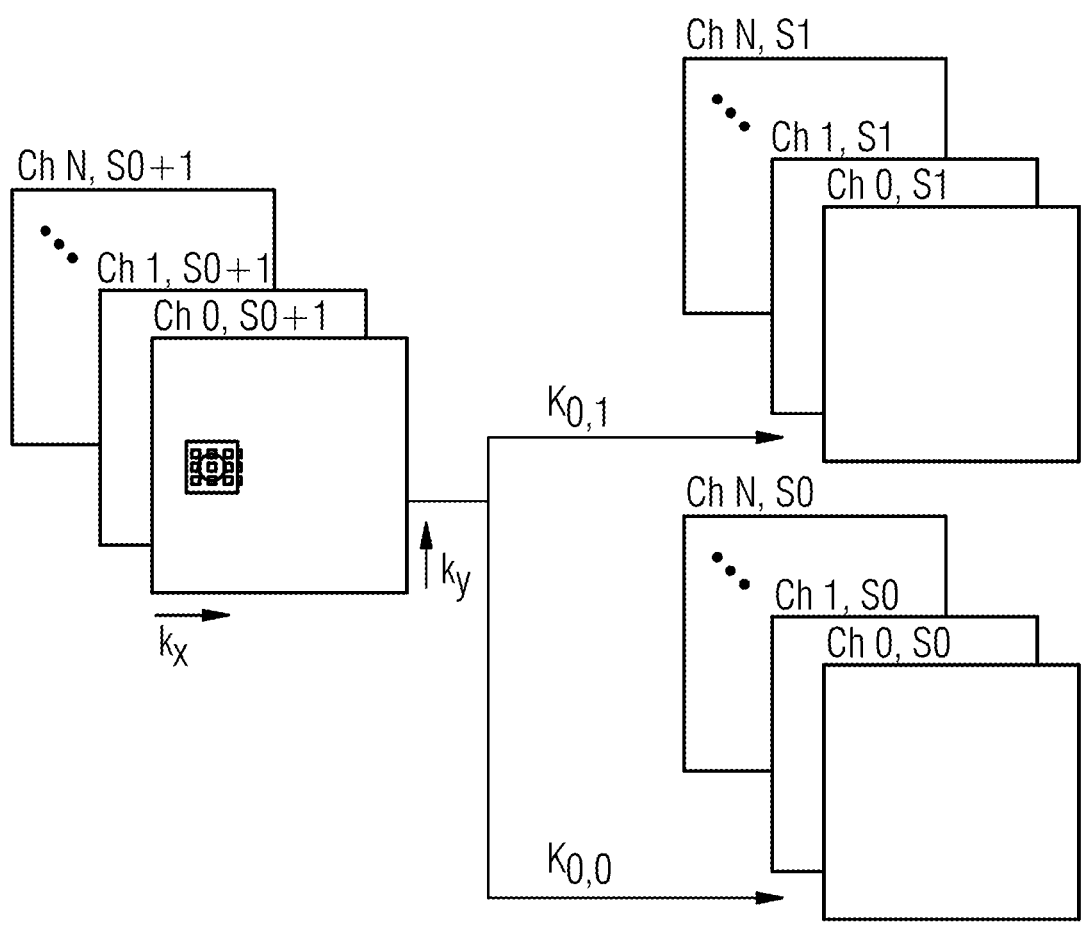
FIG. 2 illustrates the use of the convolution kernels for separating simultaneously scanned k-space raw data.

FIG. 1 and FIG. 2 illustrate schematically the mathematical procedure in a simultaneous multilayer image recording with the use of a magnetic resonance imaging method. By this procedure, the use of 2D scans reduces the required number of sequential slice scans by the factor of the SMS acceleration. Herein, typical acceleration values in the range of 2 to 6 are possible, dependent upon the imaging sequence and the body region scanned. In order to be able to disassemble the simultaneously scanned slices in the context of the reconstruction into individual slices, typically before the start of the scan, an additional reference image recording is carried out.

The separation of simultaneously scanned slices can be carried out in detail as proposed, for example, by Stab et al., MRM 65:157 (2011). The proposed method includes using the GRAPPA technique described by Griswold et al., MRM (2002), for separating simultaneously excited slices which are displaced relative to one another with the CAIPIRINHA technique of Breuer et al., MRM (2005). For this purpose, in the context of a reference scan, also designated a "calibration scan" (before carrying out the imaging pulse sequence), the volume to be imaged is scanned. Herein, for example, a complete volume is scanned with identical protocol parameters without the use of the SMS acceleration. From this reference data, the signal that would be expected on simultaneous excitation of a number of slices is created artificially.

The protocol parameters of the reference scan must, however, not be identical to the subsequently used protocol parameters. On the contrary, suitable sequences can be selected which allow for rapid acquisition and have advantageous properties (e.g. being robust against movement). This procedure is described by Bhat et al., ISMRM 22 (2014) (ISMRM=International Society for Magnetic Resonance in Medicine).

In FIG. 1, Chn, Si denotes scanned frequency data of the coil element n (n=0 to N, where n is a natural number) from the slice Si (in FIG. 1, i=0) of the sequential scan and Chn, Sj denotes the scanned frequency data of the coil element Chn from the slice j (in FIG. 1, j=1) of the sequential scan. The image information from the slices i, j is combined in a convolution matrix $(M_i+M_j)$ (in FIG. 1, the convolution matrix $(M_0+M_1)$ is shown) which represents the simultaneously scanned data. Herein, for each slice j to be separated, a convolution kernel $K_{n,j}$ is determined which is capable of extracting the image information $I_{n,j}$ of the slice j from the convolution matrix $(M_i+M_j)$. Herein, n stands for the nth coil CHn.

In the context of the image acquisition by the SMS-accelerated MR sequence, the convolution kernels thus determined are used to disassemble the information scanned with a plurality of coils simultaneously regarding a number of slices into the image information associated with individual slices and coils. This procedure is shown in FIG. 2. For example, in FIG. 2, a convolution kernel $K_{0,1}$ is shown with which the mixed raw data of the slices 0 and 1 of all coils Ch0-ChN is weighted in order to obtain the raw data associated with the slice 1. Furthermore, in FIG. 2, a convolution kernel K0,0 is also shown which extracts the raw data of the slice 0 from the mixed raw data of the slices 0 and 1 of the coils Ch0-ChN.

In order to calculate a data point in the raw data slice S0 of the coil element Ch0, the scanned raw data of the simultaneously scanned slices S0+S1 of all the coil elements Ch0 to ChN are weighted with the respective associated kernels $K_{n,0}$. The calculation of a data point requires the use of N specific kernels where N is the number of coil elements. Thus, for the separation of the simultaneously scanned raw data, there exists in total a number of different kernels which results from the product of the square of the number N of the coil elements, the SMS factor (acceleration factor) and the number of excitations.

The calculation of the individual point P in the separated raw data signal Ch0, S0 iterates across all the (still unseparated) data Ch0, S0+1 to ChN, S0+1 and at the point P of each as yet unseparated data set n (that is, Chn, S0+1) the kernel relating to this coil, to this excitation S0+1 for this separated target layer S0 is applied. The result of these applications is summed and produces the value at the point P in the separated raw data signal Ch0, S0.

Figure 3:
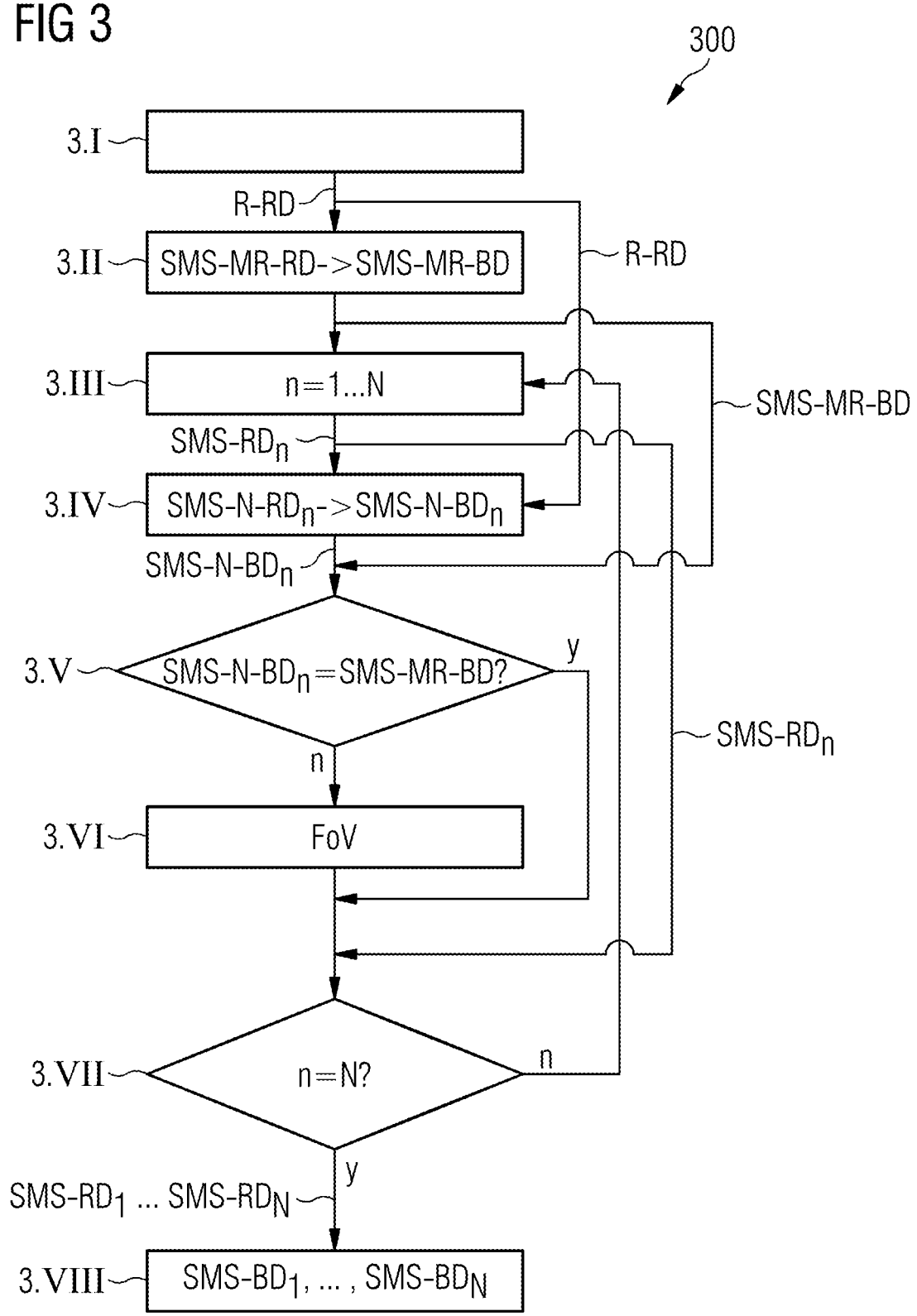
FIG. 3 is a flowchart that illustrates the magnetic resonance imaging method according to an exemplary embodiment of the invention.

FIG. 3 shows a flowchart 300 that illustrates a magnetic resonance imaging method for generating a number of image data sets of an image recording region FoV of an examination object with differently selected imaging parameters according to one exemplary embodiment of the invention. In the step 3.I, initially magnetic resonance reference raw data R-RD are recorded (acquired) from the image recording region FoV. The magnetic resonance reference raw data R-RD are recorded sequentially, in contrast to the diagnostic raw data $SMS-RD_n$ to be used to subsequently reconstruct the actual image recordings, i.e. data from individual slices are recorded sequentially and not simultaneously. On the basis of this single slice recording and the magnetic resonance reference raw data R-RD obtained therefrom, as shown in FIG. 1 and FIG. 2, convolution kernels are calculated, which are used for separating magnetic resonance raw data SMS-RD recorded simultaneously in the subsequent multislice recordings, as well as for separating accelerated navigator recordings carried out between the multislice recordings.

Now, in step 3.II, a simultaneous multislice (SMS) magnetic resonance image recording of the examination region FoV is additionally carried out, magnetic resonance movement reference raw data SMS-MR-RD also being simultaneously recorded. This magnetic resonance movement reference raw data SMS-MR-RD serves for movement correction of later, simultaneously recorded magnetic resonance diagnostic raw data $SMS-RD_n$. The individual slices of the simultaneously recorded magnetic resonance movement reference raw data SMS-MR-RD can be separated from one another with the use of the magnetic resonance reference raw data R-RD recorded in step 3.I. On the basis of the magnetic resonance movement reference raw data SMS-MR-RD, furthermore, magnetic resonance movement reference image data SMS-MR-BD is reconstructed which can be used later as comparison images for movement correction of the actual image recordings.

In step 3.III, a first of a total of N (N being a natural number) simultaneous image recordings of the examination region FoV is now carried out for image display purposes.

Figure 4:
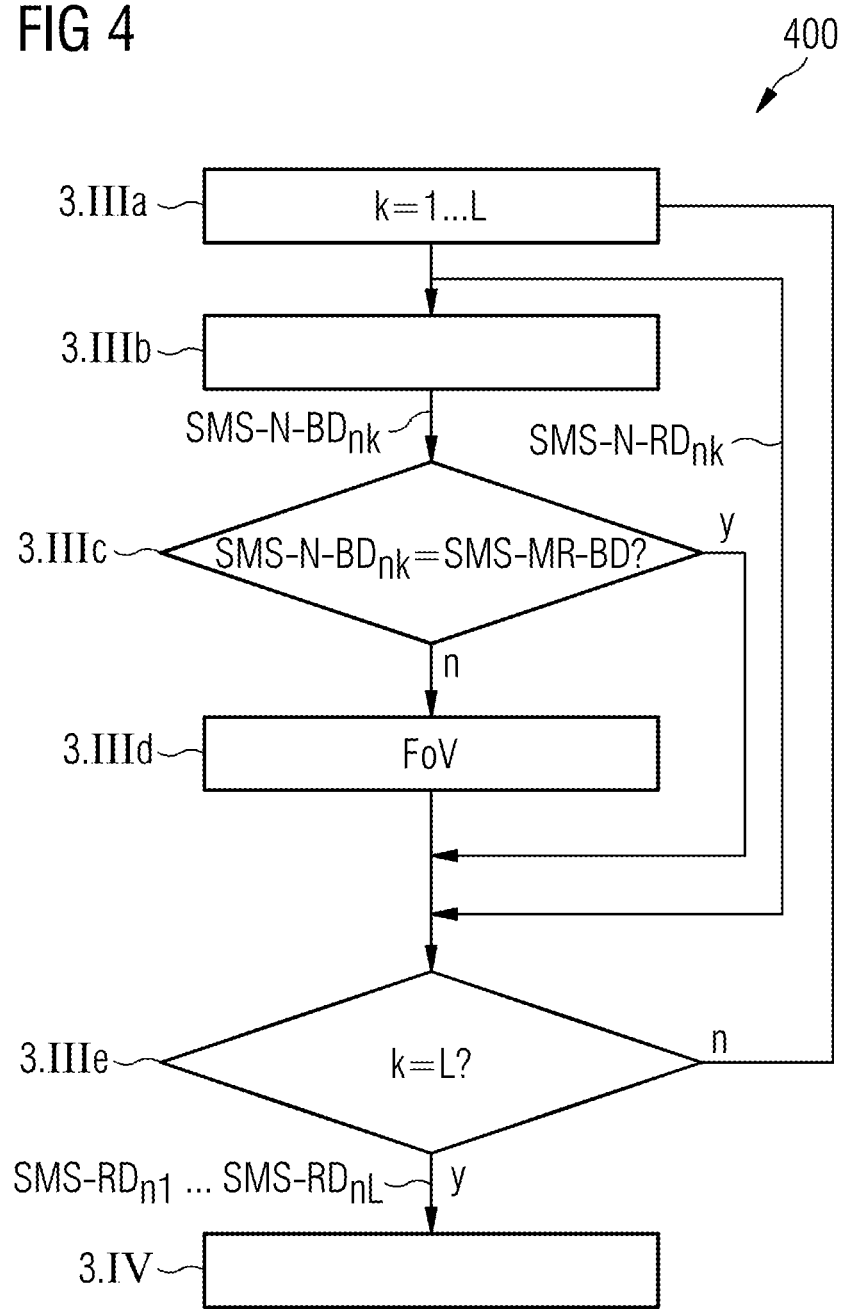
FIG. 4 is a flowchart that illustrates in detail step 3.III of the method in FIG. 3.

Herein, simultaneously recorded raw data SMS-RD$_n$ is captured from the examination region FoV. Details of the individual image recordings are illustrated in FIG. 4, in which the partial steps 3.IIIa to 3.IIIf of the step 3.III are shown.

In step 3.IV, a simultaneous navigator MR image recording is carried out, wherein simultaneous navigator raw data SMS-N-RD$_n$ is generated. On the basis of the simultaneous navigator raw data SMS-N-RD$_n$, simultaneous navigator image data SMS-N-BD$_n$ is subsequently reconstructed.

Then, in step 3.V, a comparison of the navigator image data SMS-N-BD$_n$ reconstructed on the basis of the navigator raw data SMS-N-RD$_n$ with movement reference image data SMS-MR-BD which has been reconstructed on the basis of the magnetic resonance movement reference raw data SMS-MR-RD recorded in step 3.II takes place. In the event that the two compared image data sets do not show different image regions, which is indicated in FIG. 3 with "y", a branch to step 3.VII takes place. In the event that it is determined in step 3.IV that the image region of the navigator image data SMS-N-BD$_n$ has become displaced in relation to the image region of the movement reference image data SMS-MR-BD, which is indicated in FIG. 3 with "n", a branch to step 3.VI takes place.

In step 3.VI, a correction of the field of view FoV then takes place to compensate for the displacement of the recording region. In the event that all N image recordings have been carried out, which is tested in step 3.VII and is indicated in FIG. 3 with "y", a branch to step 3.VIII takes place. If not all N images have been recorded, which is indicated in FIG. 3 with "n", a return to step 3.III takes place and steps 3.III to 3.VI are performed again. The steps 3.III to 3.VI are repeated a total of (N-1) times until all N image recordings have been carried out.

Finally, in step 3.VIII, on the basis of the simultaneously captured N magnetic resonance raw data SMS-RD$_n$ (n=1 to N), N sets of magnetic resonance image data SMS-BD$_n$ (n=1 to N) are reconstructed, which can then subsequently be represented on an image display.

In FIG. 4, a flowchart is shown that illustrates in detail the step 3.III outlined in FIG. 3 in a special embodiment. The recording of the magnetic resonance raw data SMS-RD$_n$ from the examination region FoV is herein subdivided into L partial recordings, between each of which in the context of a simultaneous navigator recording, navigator raw data SMS-N-RD$_{nk}$ is captured (k=1, . . . , L-1, where L is a natural number). Next, in step 3.IIIa, first magnetic resonance raw data SMS-RD$_{n1}$ is captured.

Subsequently, in step 3.IIIb, a first navigator image recording undertaken within an image recording takes place wherein, with the use of a simultaneous MR imaging method, navigator raw data SMS-N-RD$_{n1}$ is acquired and on the basis of the navigator raw data SMS-N-RD$_{n1}$, corresponding image data SMS-N-BD$_{n1}$ are reconstructed.

In step 3.IIIc, a comparison is then carried out between the navigator image data SMS-N-BD$_{n1}$ and the corresponding part of the magnetic resonance movement reference image data SMS-MR-BD reconstructed in step 3.II (see FIG. 3). In the event that the two compared image data sets do not show different image regions, which is indicated in FIG. 4 with "y", a branch to step 3.IIIe takes place. In the event that it is determined in step 3.IIIc that the image region of the navigator image data SMS-N-BD$_{n1}$ has become displaced in relation to the corresponding image region of the movement reference image data SMS-MR-BD, which is indicated in FIG. 3 with "n", a branch to step 3.IIId takes place.

In step 3.IIId, a correction of the field of view FoV then takes place to compensate for the displacement of the recording region. In the event that all L partial image recordings have been carried out, which is tested in step 3.IIIe and is indicated in FIG. 4 with "y", a branch to step 3.IV takes place. If not all L partial images have been recorded, which is indicated in FIG. 4 with "n", a return to step 3.IIIa takes place and steps 3.IIIa to 3.IIIe are performed again. The steps 3.IIIa to 3.IIIe are repeated a total of (L-1) times until all L partial image recordings SMS-N-BD$_{n1}$, . . . , SMS-N-BD$_{nL}$ have been carried out. Finally, the transfer to step 3.IV takes place.

Figure 5:
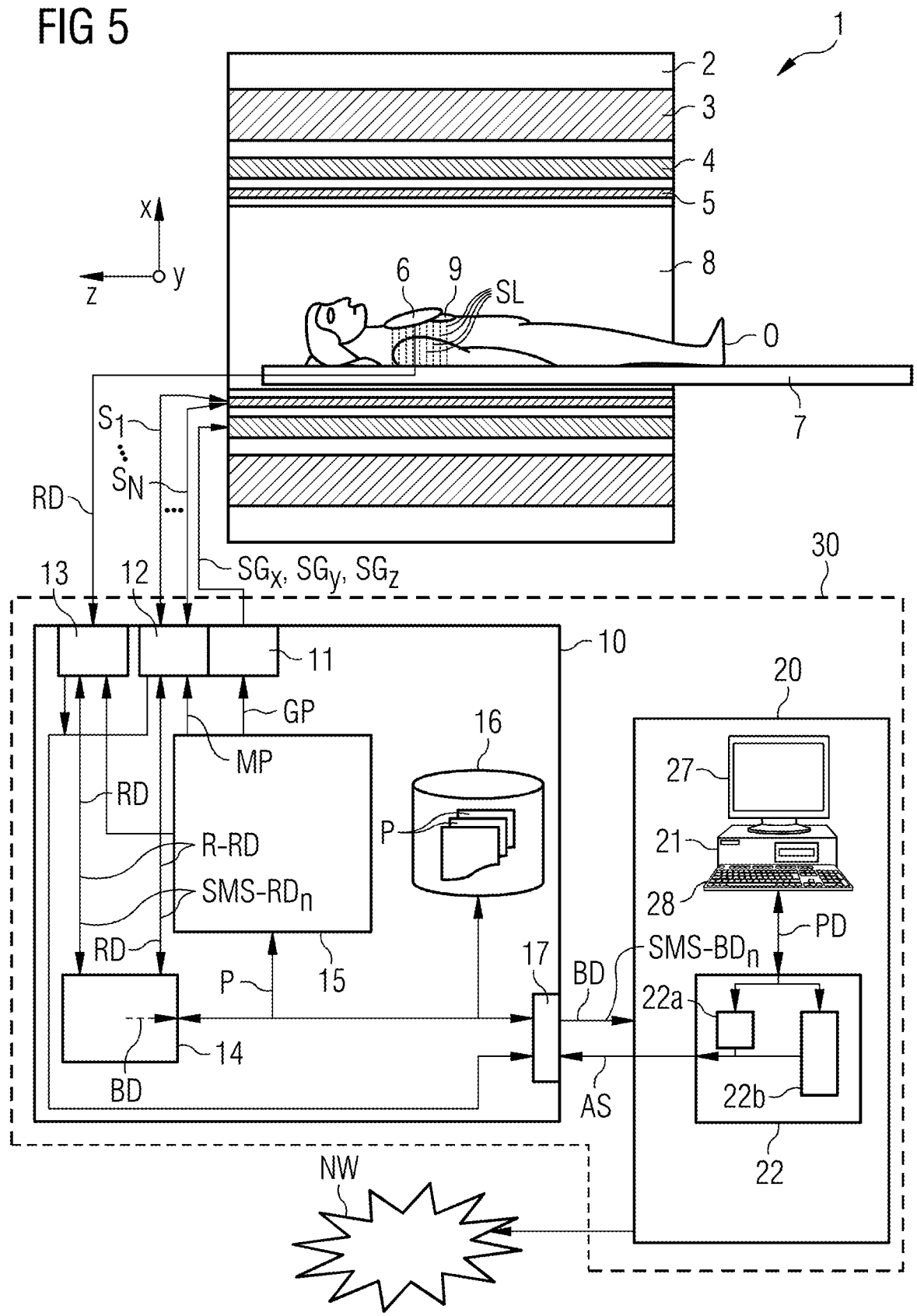
FIG. 5 is a block diagram of a magnetic resonance imaging system according to an exemplary embodiment of the invention.

FIG. 5 schematically illustrates an inventive magnetic resonance apparatus or a magnetic resonance imaging system 1, having a magnetic resonance scanner 2 with a scanning space 8 or patient bore situated therein. A bed 7 can be moved into this patient bore 8 so that an examination object O lying thereon (for example, a patient/test subject or a material to be investigated) can be placed, during an examination, at a particular position within the magnetic resonance scanner 2 relative to the magnet system and the radio-frequency system arranged therein. The bed 7 is also displaceable between different positions during a scan.

Basic components of the magnetic resonance scanner 2 are a basic field magnet 3, a gradient system 4 with gradient coils for generating magnetic field gradients in the x, y and z directions and a whole body radio-frequency coil 5.

Alternatively or additionally, local transmitting coils for exciting magnetic resonance signals can be used, as is the case, for example, for knee imaging.

The reception of magnetic resonance signals induced in the examination object O can take place with the whole body coil 5, with which typically the radio-frequency signals for inducing the magnetic resonance signals are emitted. Usually, however, these signals are received with local coils 6 placed, for example, on or under the examination object O. All these components are known, in principle, to those skilled in the art and are therefore shown only schematically in FIG. 5.

The whole-body radio-frequency coil 5 in the form, for example, of a so-called birdcage antenna, can have a number N of individual antenna rods which are separately activatable as individual transmitting channels S1, . . . , SN by a control processor 10, i.e. the magnetic resonance tomography system 1 is a pTX-capable system. However, it should be noted that the inventive method is also usable with classical magnetic resonance tomography devices having only one transmitting channel.

The magnetic resonance system 1 further has a control computer 30 according to an exemplary embodiment of the invention. The control computer 30 has the aforementioned control processor 10 and a terminal 20. The control processor 10 can be composed of individual computers, possibly spatially separated and connected to one another by suitable bus systems or cables or the like. This control processor 10 is connected, by a terminal interface 17, to the aforementioned terminal 20, via which an operator can activate the entire system 1. In the present case, this terminal 20 includes a computer 21 with a keyboard 28, one or more screens 27 and further input devices such as a mouse or the like, so that a graphical user interface is available to the user. Furthermore, the terminal 20 has additional units 22, 22a, 22b which are used for carrying out the inventive method.

The control processor 10 has, inter alia, a gradient controller 11, which can itself be formed by a number of components. The gradient controller 11 switches the individual gradient coils with control signals SGx, SGy, SGz.

This involves gradient pulses that, during a scan, are placed at precisely pre-determined temporal positions and according to a precisely pre-determined temporal sequence, in order to scan the examination object O and the associated k-space preferably in individual slices SL according to an activation sequence AS.

The control processor 10 also has a radio-frequency transmitter/receiver unit 12. This RF transmitter/receiver unit 12 also can be composed of a number of components in order to emit radio-frequency pulses separately and in parallel to the individual transmitter channels S1, . . . , SN, i.e. to the individually activatable antenna rods of the whole body coil 5. Magnetic resonance signals can also be received via the transmitter/receiver unit 12. In this exemplary embodiment, however, this takes place with the use of the local coils 6. The raw data RD received with these local coils 6 are read out and processed by an RF receiving unit 13. The magnetic resonance signals received thereby or by the whole body coil 5 by the RF transmitter/receiver unit 12 are passed as raw data RD to a reconstruction processor 14 that reconstructs the image data BD therefrom and then places the image data in a memory 16 and/or passes it, via the interface 17, to the terminal 20 so that the user can observe it. The image data BD can also be stored and/or displayed and evaluated at other sites via a network NW. If the local coils 6 have a suitable switchover unit, these can also be connected to an RF transmitter/receiver unit 12 in order also to use the local coils for transmitting, particularly in pTX operation.

The gradient controller 11, the RF transmitter/receiver unit 12 and the receiving unit 13 for the local coils 6 are each coordinated by a scan controller 15. This ensures, by corresponding commands, that a desired gradient pulse train GP is emitted according to suitable gradient control signals SGx, SGy, SGz, and controls the RF transmitter/receiver unit 12 in parallel such that a multichannel pulse train MP is emitted, i.e. that the relevant radio-frequency pulses are emitted in parallel on the individual transmitting channels S1, . . . , SN to the individual transmitter rods of the whole body coil 5. Furthermore, it must be ensured that, at the relevant time point, the magnetic resonance signals are read out at the local coils 6 by the RF receiver unit 13 and any signals in the whole body coil 5 are read out by the RF transmitter/receiver unit 12 and further processed. The scan controller 15 specifies the corresponding signals, in particular the multichannel pulse train MP to the RF transmitter/receiver unit 12 and the gradient pulse train GP to the gradient controller 11, according to a pre-determined control protocol P. In this control protocol P, all the control data which must be set during a scan according to a pre-set activation sequence AS is stored.

Typically, a number of control protocols P for different scans are stored in a memory store 16. These can be selected and possibly varied via the terminal 20 by the user, in order then to have a suitable control protocol P available for the currently desired scan, with which the scan controller 15 can operate. Furthermore, the operator can also call control protocols P via a network NW, for example, from a manufacturer of the magnetic resonance system and then, where relevant, modify and use them.

The underlying sequence of a magnetic resonance scan of this type and the above-mentioned components for activation are known to those skilled in the art, so that they will not be described in further detail herein. Furthermore, a magnetic resonance scanner 2 of this type and the associated control processor 10 can also have a number of further components, which also need not be discussed in more detail herein. It should be noted that the magnetic resonance scanner 2 can also be constructed differently, for example, with a laterally open patient space and that the radio-frequency whole body coil does not, in principle, have to be configured as a birdcage antenna.

The scan controller 15 shown in FIG. 5 serves as the aforementioned activation unit, is designed to activate the scanner 2 of the magnetic resonance imaging system 1 with an image recording sequence for generating multiple image data sets BD of an image recording region FoV of an examination object O with differently selected imaging parameters.

The image recording sequence AS is generated by a sequence generating processor 22, which in the example shown in FIG. 5 is part of the terminal 20. The sequence generating processor 22 receives protocol data PD from the computer 21. Part of the sequence generating processor 22 is a reference sequence generator 22a that generates a reference image recording subsequence for capturing a set R-RD of reference magnetic resonance raw data from an image recording region FoV. The sequence generating processor 22 also has an image sequence generator 22b that generates a number of image recording subsequences for the temporally sequential acquisition of magnetic resonance raw data sets SMS-RD$_n$ with different imaging parameters, wherein the image recording subsequences each comprise an SMS image recording sequence.

The aforementioned reconstruction computer 14, which in the exemplary embodiment shown in FIG. 5 is part of the control processor 10, serves to reconstruct a number of image data sets SMS-BD$_n$ on the basis of the acquired magnetic resonance raw data sets SMS-RD$_n$. A number of SMS image data sets SMS-BD$_n$ are each reconstructed on the basis of one of the magnetic resonance raw data sets SMS-RD$_n$ recorded with an SMS image recording sequence, and each on the basis of one and the same set of reference magnetic resonance raw data R-RD.

The described units 15, 22a, 22b, 14 of the control computer 30 for controlling the imaging can be included, as illustrated in the magnetic resonance system 1 and can also be a component of the control processor 10. However, it is also conceivable for the units to be present externally as independent components and are configured for use with a plurality of different magnetic resonance systems.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) imaging apparatus in order to generate a plurality of image data sets of an image recording region of an examination object, said method comprising:

with a control computer, operating an MR imaging apparatus in order to execute a computer-controlled reference data acquisition in order to acquire exactly one set of reference MR raw data from an image recording region of the examination object;

with said control computer, operating said MR apparatus in order to execute a computer-controlled diagnostic data acquisition of a plurality of MR raw data sets acquired temporally sequentially, with at least some of said MR raw data sets being acquired with a simultaneous multislice (SMS) image recording sequence;

in a reconstruction computer, executing a reconstruction algorithm in order to reconstruct a plurality of image data sets from said plurality of MR raw data sets recorded with said SMS image recording sequence, including reconstructing a plurality of SMS image data sets, each SMS image data set being reconstructed based on one of said MR raw data sets recorded with said SMS recording sequence and based on said acquired one set of reference MR raw data; and from said reconstruction computer, making at least said plurality of SMS image data sets available in electronic form, as at least one data file.

2. A method as claimed in claim 1 comprising, with said control computer, operating said MR apparatus in order to execute said computer-controlled diagnostic data acquisition so as to acquire said plurality of MR raw data sets temporally sequentially with respectively different imaging parameters.

3. A method as claimed in claim 1 comprising, with said control computer, operating said MR apparatus in order to execute said computer-controlled diagnostic data acquisition so as to acquire said plurality of MR raw data sets each comprising diagnostic data to be used to reconstruct said plurality of image data sets, and navigator data.

4. A method as claimed in claim 3 comprising, with said control computer, operating said MR apparatus in order to execute said computer-controlled diagnostic data acquisition with the navigator data between the acquisition of the diagnostic data of the MR raw data sets with said SMS image recording sequence.

5. A method as claimed in claim 3 wherein said image recording region exhibits movement during said computer-controlled diagnostic data acquisition, said movement being represented in said diagnostic data in the plurality of MR raw data sets, and comprising, in said reconstruction computer, using said navigator data in said reconstruction algorithm to correct for said motion represented in said diagnostic data.

6. A method as claimed in claim 3 comprising, with said control computer, operating said MR apparatus in order to execute said computer-controlled diagnostic data acquisition so as to acquire said navigator data in said plurality of SMS image data sets during a short interruption between acquisition of each individual SMS image data set.

7. A method as claimed in claim 3 comprising, in said reconstruction computer, executing said reconstruction algorithm in order to respectively reconstruct the plurality of image data sets each from the diagnostic data in one of said SMS image data sets and with said acquired one set of reference MR raw data.

8. A method as claimed in claim 3 comprising, in said reconstruction computer, executing said reconstruction algorithm in order to reconstruct a navigator image from the navigator data in each of the plurality of SMS image data sets and based on said acquired one set of reference MR data.

9. A method as claimed in claim 3 comprising, for at least some of said SMS image data sets, executing said reconstruction algorithm in said reconstruction computer so as to reconstruct said image data and to reconstruct a navigator image, from the diagnostic data and the navigator data in a respective SMS image data set, using said acquired one set of reference MR data to reconstruct said image data and said navigator image.

10. A method as claimed in claim 1 comprising, with said control computer, operating said MR apparatus in order to execute said computer-controlled diagnostic data acquisition so as to acquire said plurality of MR raw data sets temporally sequentially with respectively different imaging parameters, said different imaging parameters being selected from the group consisting of an amplitude value, an amplitude variation, a starting point and duration of said computer-controlled diagnostic data acquisition, a number of excitation pulses, a data acquisition sequence type, a slice thickness, and a slice duration.

11. A computer system for operating a magnetic resonance (MR) imaging apparatus in order to generate a plurality of image data sets of an image recording region of an examination object, said computer system comprising:

a control computer configured to operate an MR imaging apparatus in order to execute a computer-controlled reference data acquisition in order to acquire exactly one set of reference MR raw data from an image recording region of the examination object;

said control computer being configured to operate said MR apparatus in order to execute a computer-controlled diagnostic data acquisition of a plurality of MR raw data sets acquired temporally sequentially, with at least some of said MR raw data sets being acquired with a simultaneous multislice (SMS) image recording sequence;

a reconstruction computer configured to execute a reconstruction algorithm in order to reconstruct a plurality of image data sets from said plurality of MR raw data sets recorded with said SMS image recording sequence, including reconstructing a plurality of SMS image data sets, each SMS image data set being reconstructed based on one of said MR raw data sets recorded with said SMS recording sequence and based on said acquired one set of reference MR raw data; and said reconstruction computer being configured to make at least said plurality of SMS image data sets available in electronic form, as at least one data file.

12. A magnetic resonance (MR) imaging apparatus comprising:

an MR data acquisition scanner;

a control computer configured to operate said MR data acquisition scanner in order to execute a computer-controlled reference data acquisition in order to acquire exactly one set of reference MR raw data from an image recording region of an examination object;

said control computer being configured to operate said MR data acquisition scanner in order to execute a computer-controlled diagnostic data acquisition of a plurality of MR raw data sets acquired temporally sequentially, with at least some of said MR raw data sets being acquired with a simultaneous multislice (SMS) image recording sequence;

a reconstruction computer configured to execute a reconstruction algorithm in order to reconstruct a plurality of image data sets from said plurality of MR raw data sets recorded with said SMS image recording sequence, including reconstructing a plurality of SMS image data sets, each SMS image data set being reconstructed based on one of said MR raw data sets recorded with said SMS recording sequence and based on said acquired one set of reference MR raw data; and said reconstruction computer being configured to make at least said plurality of SMS image data sets available in electronic form, as at least one data file.

13. A non-transitory, computer-readable data storage medium encoded with programming instructions, said storage medium being loaded into a computer system of a magnetic resonance (MR) imaging apparatus, and said programming instructions causing said computer system to:

operate the MR imaging apparatus in order to execute a computer-controlled reference data acquisition in order to acquire exactly one set of reference MR raw data from an image recording region of an examination object;

operate the MR apparatus in order to execute a computer-controlled diagnostic data acquisition of a plurality of MR raw data sets acquired temporally sequentially, with at least some of said MR raw data sets being acquired with a simultaneous multislice (SMS) image recording sequence;

execute a reconstruction algorithm in order to reconstruct a plurality of image data sets from said plurality of MR raw data sets recorded with said SMS image recording sequence, including reconstructing a plurality of SMS image data sets, each SMS image data set being reconstructed based on one of said MR raw data sets recorded with said SMS recording sequence and based on said acquired one set of reference MR raw data; and make at least said plurality of SMS image data sets available in electronic form, as at least one data file.

\* \* \* \* \*